(12) United States Patent
Galton et al.

(10) Patent No.: US 7,602,323 B2
(45) Date of Patent: Oct. 13, 2009

(54) DIGITAL BACKGROUND CORRECTION OF NONLINEAR ERROR ADC'S

(75) Inventors: Ian Galton, Del Mar, CA (US); Andrea Panigada, San Diego, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 12/080,820

(22) Filed: Apr. 4, 2008

(65) Prior Publication Data

US 2008/0258949 A1   Oct. 23, 2008

Related U.S. Application Data

(60) Provisional application No. 60/921,745, filed on Apr. 4, 2007.

(51) Int. Cl.
   *H03M 1/10* (2006.01)
(52) U.S. Cl. ...................... 341/118; 341/162
(58) Field of Classification Search ................ 341/118, 341/120, 161, 162
   See application file for complete search history.

(56) References Cited

U.S. PATENT DOCUMENTS

| 5,047,772 | A | * | 9/1991 | Ribner | 341/118 |
| 6,734,818 | B2 | * | 5/2004 | Galton | 341/161 |
| 6,970,125 | B2 | * | 11/2005 | Cesura et al. | 341/161 |
| 2006/0227025 | A1 | * | 10/2006 | El-Sankary et al. | 341/120 |

OTHER PUBLICATIONS

Jalil et al., A Nonlinearity Error Calibration Technique Based on an Opamp Distortion Modeling, IEEE Asia Pacific Conference on Circuits and Systems, 2008. Dec. 2008, pp. 806-809.*

Murmann et al., Digital Domain Measurement and Cancellation of Residue Amplifier Nonlinearity in Pipelined ADC, IEEE Transactions on Circuits and Systems, vol. 6, No. 7, Dec. 2007, pp. 2504-2514.*

Tsimbinos, J. et al., Improved Error Table Compensation of A/D converters using pseudo random calibration signals, Electronics Letters, vol. 30, No. 6, Mar. 1994, pp. 461-462.*

(Continued)

*Primary Examiner*—Howard Williams
(74) *Attorney, Agent, or Firm*—Greer, Burns & Crain Ltd.

(57) ABSTRACT

The invention provides circuits and methods for estimating and correcting nonlinear error in analog to digital converters that is introduced by nonlinear circuit elements, for example one or more residue amplifiers in a pipelined analog to digital converter integrated circuit. In a preferred method of the invention, pseudo random calibration sequences are introduced into the digital signal to be converted by a flash digital to analog converter in one or more initial stages of the pipelined analog to digital converter circuit. A digital residue signal of the output of the one or more initial pipelined analog to digital converter stages is sampled. Intermodulation products of the pseudo random calibration sequences that are present in the digital residue signal are determined to estimate nonlinear error introduced by the residue amplifier in the one or more stages. A digital correction signal is provided to the output of the one or more stages to cancel estimated nonlinear error.

18 Claims, 9 Drawing Sheets

OTHER PUBLICATIONS

Andrew M. Abo, et al., "A 1.5-V, 10-bit, 14.3-MS/s CMOS Pipeline Analog-to-Digital Converter", *IEEE J. of Solid-State Circuits*, vol. 34, No. 5, May 1999, pp. 599-606.

Yun Chiu, et al., "Least Mean Square Adaptive Digital Background Calibration of Pipelined Analog-to-Digital Converters", *IEEE Transactions on Circuits And Systems-I: Regular Papers*, vol. 51, No. 1, Jan. 2004, pp. 38-46.

Yun Chiu, et al., "A 1.8V 14b 10MS/s Pipelined ADC in 0.18μm CMOS with 99dB SFDR", *IEEE International Solid-State Circuits Conference*, (2004).

Myung-Jun Choe, et al., "A 13-b 40-MSamples/s CMOS Pipelined Folding ADC with Background Offset Trimming", *IEEE Journal of Solid-State Circuits*, vol. 35, No. 12, Dec. 2000, pp. 1781-1790.

William T. Colleran, et al., "A 10-b, 75-MHz Two-Stage Pipelined Bipolar A/D Converter" *IEEE Journal of Solid-State Circuits*, vol. 28, No. 12, Dec. 1993, pp. 1187-1199.

Asaf Fishov, et al., "Segmented Mismatch-Shaping D/A conversion", *IEEE*, 2002, pp. IV-679-IV-682.

Ian Galton, "Spectral Shaping of Circuit Errors in Digital-to-Analog Converters", *IEEE Transactions of Circuits And Systems-II: Analog And Digital Signal Processing*, vol. 44, No. 10, Oct. 1997, pp. 808-817.

Ian Galton, "Digital Cancellation of D/A Converter Noise in Pipelined A/D Converters", *IEEE Transactions of Circuits And Systems-II: Analog And Digital Signal Processing*, vol. 47, No. 3, Mar. 2000, pp. 185-196.

Carl R. Grace, et al., "A 12-bit 80-MSample/s Pipelined ADC With Bootstrapped Digital Calibration", *IEEE Journal of Solid-State Circuits*, vol. 40, No. 5, May 2005, pp. 1038-1046.

Robert Jewett et al., "A 12b 128MSample/s ADC with 0.05LSEB DNL", *IEEE International Solid-State Circuits Conference*, 1997, pp. 138-139, 443.

John P. Keane, et al., "Background Interstage Gain Calibration Technique for Pipelined ADCs", *IEEE Transactions on Circuits And Systems-I: Regular Papers*, vol. 52, No. 1, Jan. 2005, pp. 32-43.

Stephen H. Lewis, et al., "A Pipelined 5-Msample/s 9-bit Analog-to-Digital Converter", *IEEE Journal of Solid-State Circuits*, vol. SC-22, No. 6, Dec. 1987, pp. 954-961.

Jipeng Li, et al., "A 1.8-V 67-mW 10-bit 100-MS/s Pipelined ADC Using Time-Shifted CDS Technique", *IEEE Journal of Solid-State Circuits*, vol. 39, No. 9, Sep. 2004, pp. 1468-1476.

Hung-Chih Liu, et al., A 15-b 40-MS/s CMOS Pipelined Analog-to-Digital Converter With Digital Background Calibration, *IEEE Journal of Solid-State Circuits*, vol. 40, No. 5, May 2005, pp. 1047-1056.

Iuri Meher, et al., "A 55-mW, 10-bit, 40-Msample/s Nyquist-Rate CMOS ADC", *IEEE Journal of Solid-State Circuits*, vol. 35, No. 3, Mar. 2000, pp. 318-325.

Boris Murmann, et al., "A 12-bit 75-MS/s Pipelined ADC Using Open-Loop Residue Amplification", *IEEE Journal of Solid-State Circuits*, vol. 38, No. 12, Dec. 2003, pp. 2040-2050.

K. Nair, et al., "A 96dB SFDR 50MS/s Digitally Enhanced CMOS Pipeline A/D Converter", *IEEE International Solid-State Circuits Conference*, (2004).

Jong-Bum Park, et al., "A 10-b 150-MSample/s 1.8-V 123-mW CMOS A/D Converter With 400-MHz Input Bandwidth", *IEEE Journal of Solid-State Circuits*, vol. 39, No. 8, Aug. 2004, pp. 1335-1337.

Seung-Tak Ryu, et al., "A 14-b Linear Capacitor Self-Trimming Pipelined ADC", *IEEE Journal of Solid-State Circuits*, vol. 39, No. 11, Nov. 2004, pp. 2046-2051.

Larry Singer, et al., "A 12b 65MSample/s CMOS ADC with 82dB SFDR at 120MHz", *IEEE International Solid-State Circuits Conference*, (2000).

F.J. Siragusa, et al., "Gain Error Correction Technique For Pipelined Analogue-To-Digital Convertors", *Electronic Letters*, vol. 36, No. 7, Mar. 30, 2000, pp. 617-618.

Eric Siragusa, et al., "A Digitally Enhanced 1.8-V 15-bit 40-MSample/s CMOS Pipelined ADC", *IEEE Journal of Solid-State Circuits*, vol. 39, No. 12, Dec. 2004, pp. 2126-2138.

Kazuya Sone, et al., "A 10-b 100-Msample/s Pipelined Subranging BiCMOS ADC", *IEEE Journal of Solid-State Circuits*, vol. 28, No. 12, Dec. 1993, pp. 1180-1186.

Paul C. Yu, et al., "A 14b 40MSample/s Pipelined AOC with DFCA", *IEEE International Solid-State Conference*, (2001), pp. 136-137, 439-440.

Alfio Zanchi et al., "A 16-bit 65-MS/s 3.3-V Pipeline ADC Core in SiGe BiCMOS With 78-dB SNR and 190-fs Jitter", *IEEE Journal of Solid-State Circuits*, vol. 40, No. 6, Jun. 2005, pp. 1225-1237.

* cited by examiner

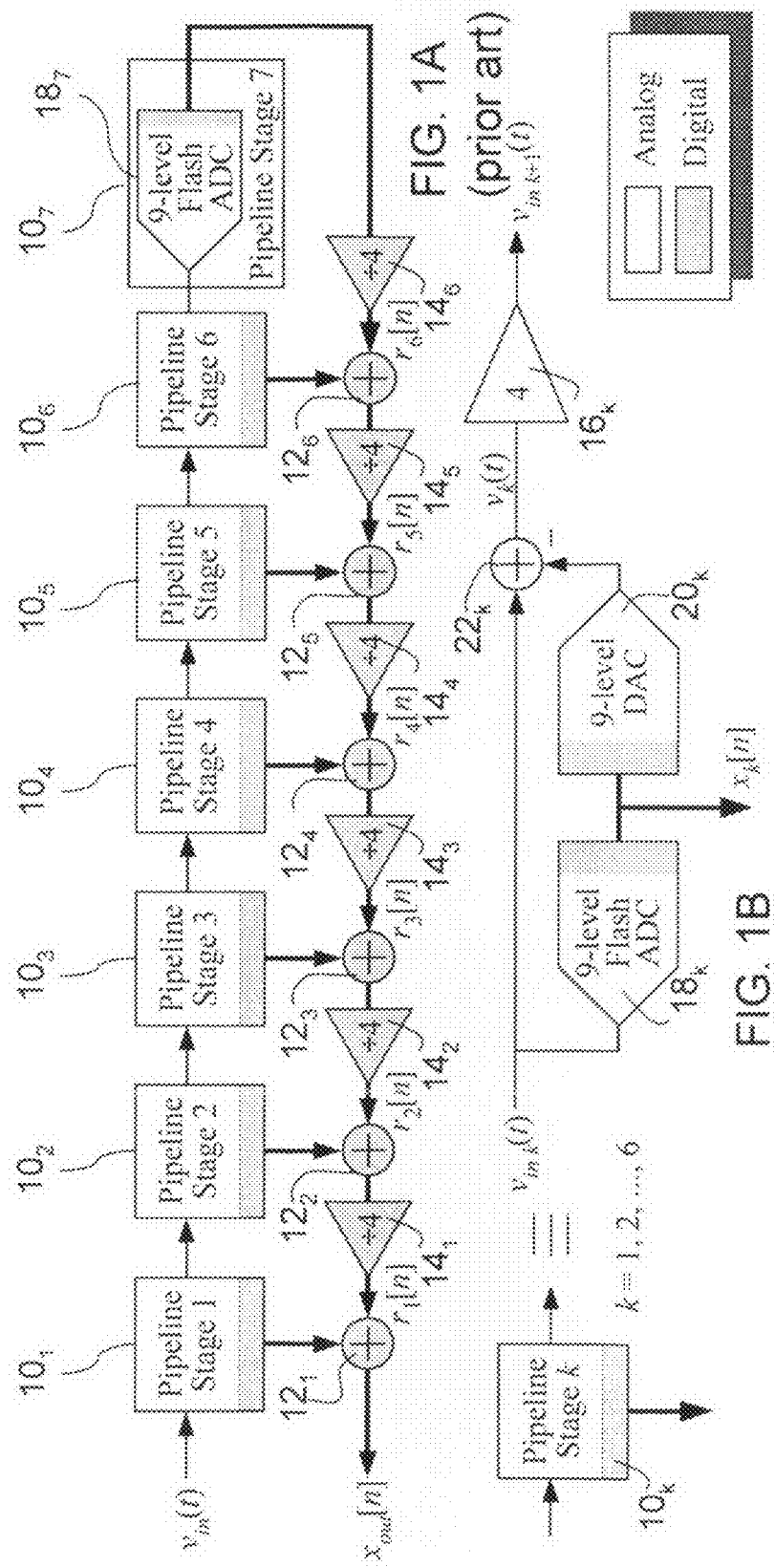

US 7,602,323 B2

DIGITAL BACKGROUND CORRECTION OF NONLINEAR ERROR ADC'S

PRIORITY CLAIM AND REFERENCE TO RELATED APPLICATION

This application claims priority under 35 U.S.C. §119 from prior provisional application Ser. No. 60/921,745, filed Apr. 4, 2007.

FIELD

A field of the invention is analog to digital conversion. Another field of the invention is integrated circuits. The invention concerns correction of nonlinear errors in analog to digital converters (ADCs).

BACKGROUND

An issue in many types of analog to digital converters (ADCs) is nonlinear distortion introduced by non-ideal circuit elements. The performance of ADCs can be improved and the constraints on circuit elements be relaxed if the nonlinear distortion can be determined and corrected.

An example ADC in which nonlinear errors are of particular concern are in pipelined ADCs. Pipelined ADCs are widely used in applications that require data converters with resolutions in the range of 10 to 16 bits and bandwidths in the range of 15 to 250 MHz. For example, such applications include cellular telephone base station receivers, 802.11 wireless LAN receivers, and 802.16 wireless metropolitan area network receivers. More generally, pipelined ADCs are attractive when the required bandwidth is too high for oversampling delta-sigma ADCs to be efficient and the required resolution is too high for flash ADCs to be efficient.

The basic operation of a pipelined ADC has each stage reducing the error from each previous stage of the ADC. In a first stage, the input signal to be converted is converted with a flash ADC. The signal from the flash ADC is combined with the results from subsequent stages to form an output. The error in the initial stage is determined by converting the result of the flash ADC in that stage to a voltage with a digital to analog converter (DAC). The difference between the input signal to the stage and the signal from the DAC is the residue from the stage. The residue from each stage, except a final stage, is amplified by a residue amplifier and then converted in the same fashion in the next stage. The ADC in each stage is a coarse conversion, but the outputs of the stages are combined to eliminate most of the quantization noise from the coarse conversions in each stage. Each pipeline stage coarsely digitizes its input and passes amplified quantization noise to the next stage. Distortion introduced by the residue amplifiers, particularly those in the first few stages, results in imperfect quantization noise cancellation. This reduces the linearity of a pipelined ADC and increases its noise floor. For this reason, pipelined ADCs are particularly sensitive to distortion introduced by the residue amplifiers in their first few stages.

Residue amplifier distortion tends to be inversely related to power consumption. The residue amplifiers are often the dominant consumers of power in high-resolution pipelined ADCs. In order to achieve high accuracy, a pipelined ADC typically relies upon high-power, high-linearity residue amplifiers. If lower power consumption is required, the resulting accuracy of the pipelined ADC is significantly compromised in the conventional pipelined ADCs. Many applications could benefit from accurate, high resolution amplifiers that have reasonable power consumption.

A 15-bit, 40-MS/s pipelined ADC integrated circuit (IC) [described in "A Digitally Enhanced 1.8V 15b 40 MS/s CMOS Pipelined ADC," E. Siragusa, I. Galton, IEEE Journal of Solid-State Circuits, vol. 39, no. 12, pp. 2126-2138, (2004).] provides a convenient circuit-level example of the issues described above. The ADC is based on the architecture shown in FIGS. 1A and 1B, but modified to include digital background calibration techniques that cancel ADC error arising from DAC capacitor mismatches and interstage gain errors. The ADC achieves over 90 dB of spurious-free dynamic range (SFDR) and 72 dB of peak signal-to-noise-and-distortion ratio (SNDR) over the 20 MHz bandwidth. To achieve sufficiently low distortion for this level of ADC performance, high-power residue amplifiers are used in the design: the op-amps in the residue amplifiers consume approximately 80% of the 400 mW consumed by the entire IC.

Had the sample-rate been higher than 40 MHz, even higher-performance, and, therefore, higher-power, residue amplifiers would have been required to maintain the same SFDR and peak SNDR. For example, circuit simulations indicate that the pipelined ADCs SFDR and peak SNDR drop to 65 dB and 56 dB, respectively if the sample-rate is increased to 100 MHz without improving the performance of the residue amplifiers. Simulation of the residue amplifier stage indicates that this reduction in performance comes from both linear gain error associated with incomplete settling and from third order distortion. The use of differential circuitry causes the even-order terms to be negligible in this example relative to the target specifications of 90 dB SFDR and 72 dB peak SNDR, and, although higher-order distortion terms are present, they too are negligible in this example.

Pipelined ADCs have been proposed with nonlinear error correction. Examples include B. Murmann, B. Boser, "A 12b 75 MS/s Pipelined ADC using Open-Loop Residue Amplification," IEEE Journal of Solid-State Circuits, vol. 38, no. 12, pp. 2040-2050, December 2003; J. P. Keane, P. J. Hurst, S. H. Lewis, "Background Interstage Gain Calibration Technique for Pipelined ADCs," IEEE Transactions on Circuits and Systems I, vol. 52, no. 1, pp. 32-43, January 2005.

SUMMARY OF THE INVENTION

A method of the invention estimates and corrects nonlinear error in an analog to digital converter by introducing uncorrelated pseudo random sequences prior to a source of distortion in the converter. After digital conversion, the method determines intermodulation products of the pseudo random sequences. Nonlinear error is estimated from the intermodulation products and used to correct for the nonlinear error. A preferred embodiment of the invention provides circuits and methods for estimating and correcting nonlinear error introduced by one or more residue amplifiers in a pipelined analog to digital converter integrated circuit. In a preferred method of the invention, pseudo random calibration sequences are introduced into the digital signal to be converted by a digital to analog converter in one or more initial stages of the pipelined analog to digital converter circuit. A digital residue signal of the output of the one or more initial pipelined analog to digital converter stages is sampled. Intermodulation products of the pseudo random calibration sequences that are present in the digital residue signal are determined to estimate nonlinear error introduced by the residue amplifier in the one or more stages. A digital correction signal is provided to the output of the one or more stages to cancel estimated nonlinear error.

BRIEF DESCRIPTION OF THE DRAWINGS

FIGS. 1A and 1B (prior art) are simplified block diagrams of a typical seven-stage pipelined ADC circuit (FIG. 1A) and a stage in the circuit (FIG. 1B);

DETAILED DESCRIPTION OF THE PREFERRED EMBODIMENTS

Figures 2A, 2B:
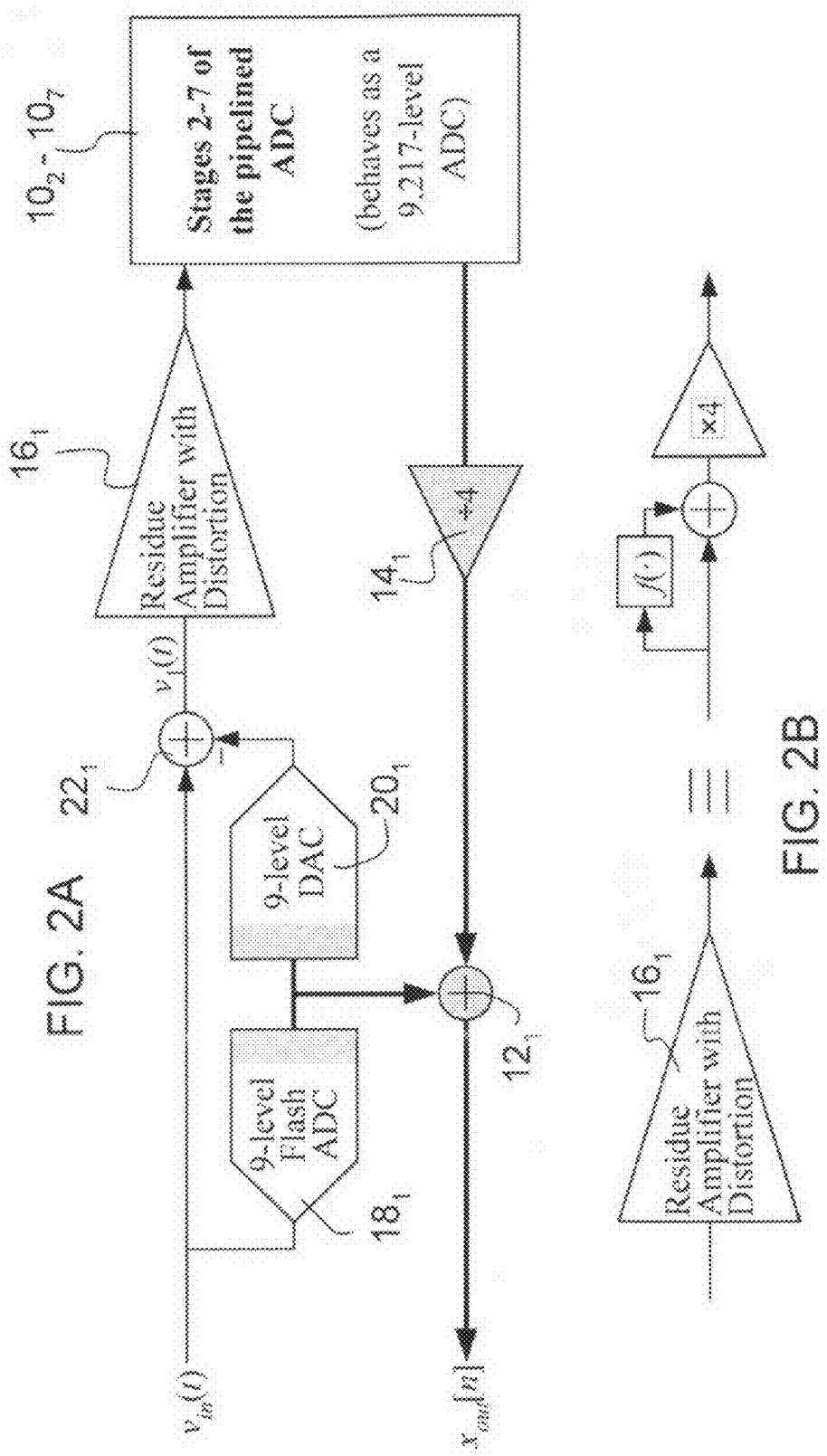
FIGS. 2A and 2B illustrate an assumption that only the residue amplifier in the first stage of the FIGS. 1A and 1B pipelined ADC circuit introduce distortion.

Preferred embodiments of the invention provide methods and circuits for digital background correction of nonlinear error in ADCs. In an example application, nonlinear error in the form of harmonic distortion from residue amplifiers in pipelined analog to digital converter (ADC) and a pipelined ADC with digital background of harmonic distortion is addressed. Artisans will appreciate, however, that methods of the invention can be used to determine and correct nonlinear error in other types of ADCs.

A preferred general method of the invention estimates and corrects nonlinear error in an analog to digital converter by introducing uncorrelated pseudo random sequences prior to a source of distortion in the converter. After digital conversion, the method determines intermodulation products of the pseudo random sequences. Nonlinear error is estimated from the intermodulation products and used to correct for the nonlinear error. A preferred embodiment of the invention In methods and circuits of the invention, ADC error arising from distortion introduced by residue amplifiers in a pipelined ADC is measured and substantially canceled. In preferred embodiment circuit architectures, cancelling the ADC error permits the use of higher-distortion and, therefore, lower-power residue amplifiers than are used in typical high-accuracy pipelined ADCs. Preferred embodiment architectures significantly reduce overall power consumption relative to conventional pipelined ADCs. Methods of the invention work for any pipelined ADC input signal, and do not have restrictions with respect to dc input signals, and are insensitive to amplifier offsets.

Embodiments of the invention relax the traditional tradeoff between power and accuracy by allowing a less linear residue amplifier to be used in a high resolution pipelined ADC. Such amplifiers introduce harmonic distortion, but the invention provides digital circuitry that corrects for the distortion and can be formed directly in the integrated circuit with the pipelined ADC.

Embodiments of the invention can provide a high resolution pipelined ADC that consumes significantly less power while only adding a small amount of circuit area (e.g., 10%) to the integrated circuit footprint in modern deep sub-micron CMOS technologies. Such a reduction in power consumption is especially advantageous for mobile devices constrained to battery life (PDA, cell-phone, portable computers, etc.) and/or concentrated hardware deployments where heat build-up is an issue of concern (e.g., base stations, video devices, audio devices, etc).

Preferred embodiment correction circuitry and methods of the invention digitally measure and cancel ADC error arising from distortion introduced by the residue amplifiers in a pipelined ADC. This makes it possible to reduce the power consumption of the op-amps in a given pipelined ADC without sacrificing ADC accuracy. A correction method of the invention is implemented in circuitry that operates in the background during normal operation of the pipelined ADC, so it adapts to environmental changes without the need to interrupt normal operation of the ADC. While a significant amount of digital signal processing is involved for the correction method, the reduction in op-amp power consumption is expected to far exceed the increase in power consumption from the extra digital logic. Correction methods and circuits of the invention are applicable to any pipelined ADC input signal, have no restrictions with respect to dc input signals and are insensitive to amplifier offsets.

Preferred embodiments of the invention will now be discussed with respect to the drawings. The drawings may include schematic representations, which will be understood by artisans in view of the general knowledge in the art and the description that follows. Features may be exaggerated in the drawings for emphasis, and features may not be to scale.

FIG. 1A (prior art) is a simplified block diagram of a typical seven-stage pipelined ADC circuit. FIG. 1B (prior art) illustrates a stage in the pipelined ADC circuit of FIG. 1A. In the pipelined ADC of FIG. 1, each pipeline stage $10_1$-$10_6$ coarsely digitizes its input and passes amplified quantization noise to the next stage. A final stage $10_7$ simply performs a coarse ADC of the amplified quantization noise from the previous stage $10_6$ to have its output summed by summer $12_6$ with the output of the previous stage $10_6$ after being divided by an amplifier $14_6$ that accounts for the gain of a corresponding residue amplifier $16_6$. Distortion introduced by the residue amplifiers $16_k$, particularly those in the first few stages, results in imperfect quantization noise cancellation. This reduces the linearity of a pipelined ADC and increases its noise floor. The last stage $10_7$ consists of just a 9-level flash ADC $18_7$. Omitted in the simplified illustration of FIGS. 1A and 1B are a sample and hold circuit and delay circuit for each stage $10_k$.

All the flash ADCs $18_k$ and DACs $20_k$ are clocked simultaneously at a sample rate of $f_s = 1/T_s$. The ideal behavior of each flash ADC $18_k$ is to update its digital output each sample time to whichever of the 9 values, $-4\Delta, -3\Delta, \ldots, 4\Delta$, is closest to the input voltage at that sample time, where $\Delta$ is the quantization step-size of the flash ADC $18_k$. From a signal processing point of view, each flash ADC $18_k$ ideally acts as a 9-level uniform quantizer, and the output of the kth flash ADC $18_k$ is given by $$x_k[n] = v_{in\,k}(nT_s) + e_{ADC\,k}[n], \quad (1)$$

where $v_{in\,k}(t)$ is the flash ADCs $18_k$ input signal, and $e_{ADC\,k}[n]$ is the quantization error introduced by the flash ADC $18_k$. The input no-overload range of each flash ADC $18_k$, and, therefore, the usable input range of each pipeline stage, is $-4.5\Delta$ to $4.5\Delta$, because the magnitude of the quantization error introduced by the flash ADC $18_k$ is bounded by $\Delta/2$ for input voltages within this range and exceeds $\Delta/2$ otherwise. The ideal behavior of each DAC $20_k$ is to convert the format of its input from a digital representation (e.g., bits) to an analog representation (e.g., voltage) without introducing distortion or noise. From a signal processing point of view an ideal DAC $20_k$ performs no numerical operation. It follows that in the absence of non-ideal circuit behavior the input to and output of the kth residue amplifier at the nth sample time are given by $$v_k(nT_s) = -e_{ADC\,k}[n], \text{ and } v_{in\,k+1}(nT_s) = 4v_k(nT_s), \quad (2)$$

respectively.

The outputs of the flash ADCs $18_k$ are combined as shown in FIG. 1A to form the output of the pipelined ADC, $x_{out}[n]$. The output, $r_k[n]$, of each digital divide-by-four block $14n$ is called the digitized residue of the kth stage. As can be seen from FIG. 1A, $r_k[n] = (r_{k+1}[n] + x_{k+1}[n])/4$ for $k=1, 2, \ldots, 5$, so recursive application of (1) and (2) gives $$r_k[n] = v_k(nT_s) + \frac{1}{4^{7-k}} e_{ADC7}[n]. \quad (3)$$

In the absence of non-ideal circuit behavior, the quantization error sequences from all but the last pipeline stage cancel to give $$x_{out}[n] = v_{in}(nT_s) + \frac{1}{4096} e_{ADC7}[n]. \quad (4)$$

Since $e_{ADC\,7}[n]$ is bounded in magnitude by $\Delta/2$ and the first pipeline stage $10_1$ has a usable input range of $-4.5\Delta$ to $4.5\Delta$, this represents slightly more than 15-bit analog-to-digital conversion accuracy.

With ideal circuit behavior, the magnitude of the quantization error from each flash ADC $18_k$ is bounded by $\Delta/2$, so the analog output of each pipeline stage ideally never exceeds $2\Delta$ in magnitude. However, non-ideal circuit behavior such as comparator offset voltages can cause the analog outputs of the pipeline stages to have magnitudes that exceed $2\Delta$ from time to time. To accommodate such over-range conditions, the useable input range of the second through seventh pipelined stages is maintained at $-4.5\Delta$ to $4.5\Delta$ instead of $-2\Delta$ to $2\Delta$. In this case, the pipelined ADC is said to have an over-range margin of $\pm 2.5\Delta$. The over-range margin greatly relaxes the performance requirements of the flash ADCs in pipelined ADCs.

The effect of residue amplifier distortion can be demonstrated by considering the pipelined ADC of FIGS. 1A and 1B with all ideal components except for the residue amplifier $16_1$ in the first stage. FIGS. 2A and 2B represent this assumption, wherein a function, $f$, is used to represent distortion introduced by the first stage's residue amplifier $16_1$.

The distortion introduced by a practical residue amplifier tends to be well-modeled as a memoryless, weakly non-linear function of the amplifiers input voltage, so it can be approximated accurately by its first N Taylor series coefficients where N typically is small (e.g., $N \leq 5$ is common). Consequently, the distortion function, $f$, in FIGs. is given by $$f(v_1) = \sum_{n=1}^{N} \alpha_n v_1^n. \quad (5)$$

The same argument used above to obtain (4) implies that the output of the pipelined ADC is now $$x_{out}[n] = x_{out}[n]|_{ideal} + f(v_1(nT_s)), \quad (6)$$

where $x_{out}[n]|_{ideal}$ is the ideal output of the pipelined ADC given by (4). For example, suppose $\alpha_n = 0$ for all n except $n=1$. This implies that the distortion is just a gain error, i.e., linear distortion. In the absence of other non-ideal circuit behavior, $v_1(nT_s) = e_{ADC\,1}[n]$ and is, therefore, bounded in magnitude by $\Delta/2$, so it follows from equation (6) that the maximum magnitude of the error from the non-ideal residue amplifier gain is $f(\Delta/2) = |\alpha_1|\Delta/2$. It follows from equation (4) that the quantization error introduced by the ideal version of the pipelined ADC has a maximum magnitude of $\Delta/8192$. Hence, a gain error of just $\alpha_1 = 1/4096$ is sufficient to cause the resulting pipelined ADC error to be comparable in magnitude to the pipelined ADCs quantization error. More generally, if $\alpha_n = (\Delta/2)^{1-n}/4096 = 2^{n-13}\Delta^{1-n}$, the nth term in (5) gives rise to an error component in the pipelined ADC output with a magnitude comparable to the pipelined ADCs quantization error.

Figure 3:
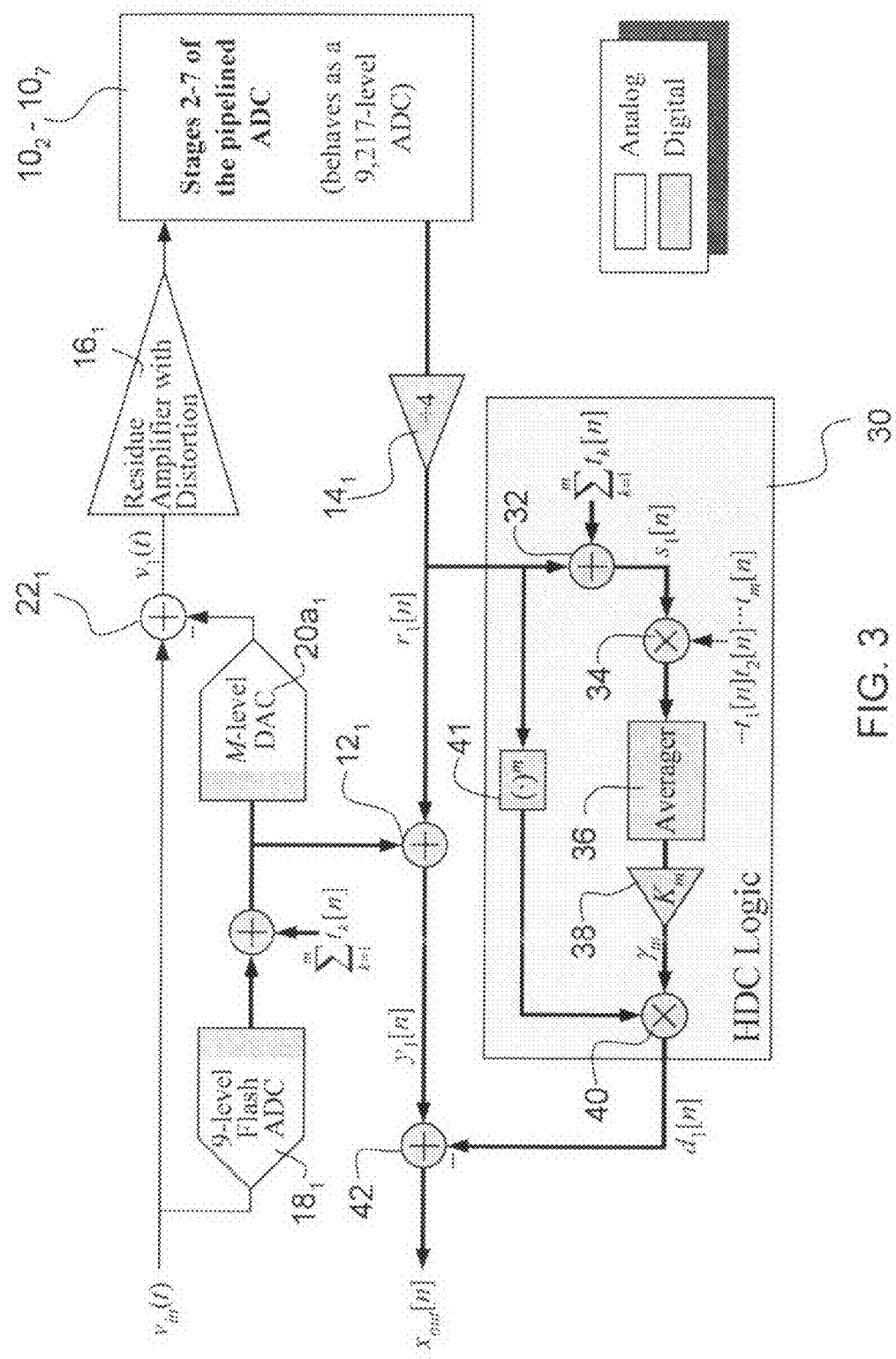
FIG. 3 illustrates a preferred embodiment method and basic circuit logic for correction of mth-order residue amplifier distortion.

The invention provides methods and circuits for correcting the harmonic noise in generally pipelined ADCs, including the example pipelined ADC illustrated in FIGS. 1A and 1B. FIG. 3 illustrates a method and circuit 30 of the invention for $m^{th}$-order harmonic distortion correction. The method and circuit are applied, for purposes of illustration, to the simplified representation of the first stage $10_1$ that is illustrated in FIGS. 2A and 2B.

The stage considered in FIG. 3 is the first stage $10_1$ and a simplified case is considered first. The simplification assumes that the residue amplifier $16_1$ in the first stage $10_1$ introduces only $m^{th}$-order distortion, i.e., $f(v_1) = \alpha_m v_1^m$ for some integer, m, and all other components in the pipelined ADC are ideal.

In the invention, a set of m uncorrelated, two-level, pseudo-random, digital calibration sequences, $t_1[n], t_2[n], \ldots, t_m[n]$, each of which takes on values of $\pm A$, is zero-mean, and is independent of the pipelined ADCs input signal, are added to the output of the flash ADC $18_1$. The pseudo-random digital calibration sequences $t_1[n], t_2[n], \ldots, t_m[n]$ are converted to analog form along with the output sequence from the flash ADC $20_1$, so the input to residue amplifier at the nth sample time is $$v_1(nT_s) = -e_{ADC1}[n] - \sum_{k=1}^{m} t_k[n]. \quad (7)$$

The amplitude, A, of the calibration sequences is chosen such that the sum of the calibration sequences has a maximum amplitude of approximately $\Delta/4$. Since the sum of the calibration sequences is amplified along with the quantization error from the flash ADC $20a_1$, this implies that approximately half of the over-range margin is taken up by the calibration sequences, which leaves the other half of the over-range margin for error associated with non-ideal circuit behavior. The ADC $20a_1$ has M levels, which is a necessary number of levels greater than the 9 levels of the flash DAC $18_1$. to accommodate the calibration sequences.

The calibration sequences $t_1[n], t_2[n], \ldots, t_m[n]$ are subjected to the distortion function of the residue amplifier $16_1$ along with the quantization error from the first pipeline stage $10_1$, and, by reasoning similar to that above to obtain equation (3), $$r_1[n] = v_1(nT_s) + \alpha_m v_1^m(nT_s) + \frac{1}{4096}e_{ADC7}[n]. \quad (8)$$

It follows that the pipelined ADC output prior to correction of the method of the invention is $$y_1[n] = v_{in}(nT_s) + \alpha_m v_1^m(nT_s) + \frac{1}{4096}e_{ADC7}[n]. \quad (9)$$

The purpose of the correction circuit 30 is to estimate intermodulation products, in this case $\alpha_m v_1^m(nT_s)$, of the pseudo random sequence to cancel the $m^{th}$-order distortion in $y_1[n]$, i.e., the second term in equation (9). The circuit correlates the residue amplifiers output $r_1[n]$ against the product of the calibration sequences, $t_1[n]t_2[n]\cdot t_m[n]$. The correlation involves multiplying the digital sequence $$s_1[n] = r_1[n] + \sum_{k=1}^{m} t_k[n] \quad (10)$$

$$= -e_{ADC1}[n] + \alpha_m v_1^m(nT_s) + \frac{1}{4096}e_{ADC7}[n]$$

by $t_1[n]t_2[n]\cdot t_m[n]$, a two-level sequence that takes on values of $\pm A^m$, and averaging the result. A summer 32 obtains $s_1[n]$ by adding $r_1[n]$ with the calibration sequences $t_1[n]$, $t_2[n]$, . . . , $t_n[n]$. A multiplier 34 then multiplies $s_1[n]$ with the calibration sequences $t_1[n], t_2[n], \ldots, t_m[n]$. Since the calibration sequences are zero-mean, uncorrelated with each other, and independent of the pipelined ADCs input signal, it follows that $t_1[n]t_2[n]\cdot t_m[n]$ is uncorrelated with all of the terms in equation (10) except the term $(m!)t_1[n]t_2[n]\cdot t_m[n]\alpha_m$ that occurs in the expansion of $v_1(nT_s)$, as given by equation (7), raised to the $m^{th}$ power. Consequently, an averager 36 provides the average of $s_1[n]$ times $t_1[n]t_2[n]\cdot t_m[n]$ over n, which is $(m!)A^{2m}\alpha_m$. An amplifier 38 multiplies the output of the averager 36 by $K_m = A^{-2m}/(m!)$ to obtain $\gamma_m$ which is an estimate of $\alpha_m$. A multiplier 40 then multiplies $\gamma_m$ by $r_1^m[n]$, which is obtained by a exponential multiplier 41, to obtain the estimate of $\alpha_m v_1^m(nT_s) = d_1[n]$. The negative of the estimate of $d_1[n]$ is then added to the signal $y_1[n]$ by adder 42 to cancel $\alpha_m v_1^m(nT_s)$ (see equation 9).

To the extent that the calibration sequences $t_1[n]t_2[n]\cdot t_m[n]$ have the above-mentioned statistical properties (zero-mean, uncorrelated with each other, and independent of the pipelined ADCs input signal), $\gamma_m$ converges exactly to $\alpha_m$ as the number of samples averaged by the digital correction circuit 30 increases; the more samples in the average, and the better the estimate of $\alpha_m$. This convergence occurs regardless of the pipelined ADCs input signal, so the circuit 30 performs background calibration, i.e., it functions during normal operation of the pipelined ADC. After an initial convergence time during which the averager 36 obtains a sufficiently accurate estimate of $\alpha_m$ that the pipelined ADCs accuracy is limited by non-ideal circuit behavior other than $m^{th}$-order residue amplifier distortion, the pipelined ADC operates at its full accuracy, and the circuit 30 continues to track slow variations in $\alpha_m$ that can occur because of temperature changes to the integrated circuit or as the integrated circuit ages.

Although the estimate of $\alpha_m$ has an accuracy that depends only upon the number of samples averaged by correction circuit 30, the accuracy of the estimate of $\alpha_m v_1^m(nT_s)$ is limited by the presence of unwanted higher-order terms that occur in $r_1^m[n]$. For example, it follows from (8) that if m=3 and the small to last term of equation (8) is neglected, then $$\alpha_3 r_1^3[n] \cong \alpha_3 v_1^3(nT_s) + \underbrace{3\alpha_3^2 v_1^5(nT_s) + 3\alpha_3^3 v_1^7(nT_s) + \alpha_3^4 v_1^9(nT_s)}_{\text{unwanted terms}}. \quad (11)$$

The unwanted terms in equation (11) tend to be small, and can be neglected in practice.

A straightforward extension of the analysis above shows that $\gamma_m$ converges to $\alpha_m$ even if the residue amplifiers distortion function contains lower-order distortion terms. Thus, even if any of the $\alpha_i$ for i<m are non-negligible in equation (5), the correction circuit 30 accurately estimates $\alpha_m$.

The logic in the correction circuit 30 can also be extended to accomplish correction if any of the $\alpha_i$ for i>m are non-negligible. The correction circuit can be extended to correct $5^{th}$ order distortion, for example. This would be desirable if the reside amplifier $16_1$ introduces non-negligible higher order harmonic noise.

For example, assume that the circuit 30 is implemented to correct for third-order distortion, with m=3, but instead of the residue amplifier $16_1$ introducing only third-order distortion, it introduces first-order, third-order, and fifth-order distortion. That is, $f(v_1) = \alpha_1 v_1 + \alpha_3 v_1^3 + \alpha_5 v_1^5$. In this case equation (10) becomes $$s_1[n] = \quad (12)$$

$$-e_{ADC1}[n] + \alpha_1 v_1(nT_s) + \alpha_3 v_1^3(nT_s) + \alpha_5 v_1^5(nT_s) + \frac{1}{4096}e_{ADC7}[n]$$

with $v_1(nT_s)$ still given by equation (7). Expanding the fifth-order term in equation (12) results in several cross-terms that are correlated with the product of the calibration sequences, $t_1[n]t_2[n]t_3[n]$. These terms cause $\gamma_3$ to converge to a value that differs from $\alpha_3$. Specifically, $\gamma_3$ now converges to $$\alpha_3 + [30A^2 + 10\langle e_{ADC1}^2[n]\rangle]\alpha_5 \quad (13)$$

as the number of averaged samples increases, where $\langle e_{ADC1}^2[n]\rangle$ denotes the average of $e_{ADC1}^2[n]$. The presence of non-negligible fifth-order residue amplifier distortion prevents the circuit 30 from achieving the same level of correction as when the unwanted $\alpha_5$ term in (13) was negligible.

As another example, consider the same distortion function, but suppose m=1. In this case the logic in the correction circuit 30 of FIG. 3 correlates a single calibration sequence, $t_1[n]$, against $r_1[n]$ to obtain $\gamma_1$. In the absence of third-order and fifth-order distortion, $\gamma_1$ would converge to $a_1$. However, the third-order and fifth-order terms in (12) contain several cross-terms that are correlated with $t_1[n]$. Consequently, $\gamma_1$ converges to $$\alpha_1 + [13A^2 + 3\langle e_{ADC1}^2[n]\rangle]\alpha_3 + [241A^4 +$$
$$130A^2\langle e_{ADC1}^2[n]\rangle + 5\langle e_{ADC1}^4[n]\rangle]\alpha_5. \quad (14)$$

The logic applied by the correction circuit 30 in FIG. 3 can be modified for cases such as these examples in which the residue amplifiers $16_1$ distortion function has more than one non-negligible term. The logic of the correction circuit 30 can be extended to use N two-level calibration sequences, correlate $r_1[n]$ against $t_1[n]t_2[n]\cdots t_k[n]$ to obtain $\gamma_k$ for each $k=1, 2, \ldots, N$, at which $\alpha_k$ is non-negligible, and estimate the unwanted terms in each $\gamma_k$ value to obtain an estimate of the corresponding $\alpha_k$.

Figure 4:
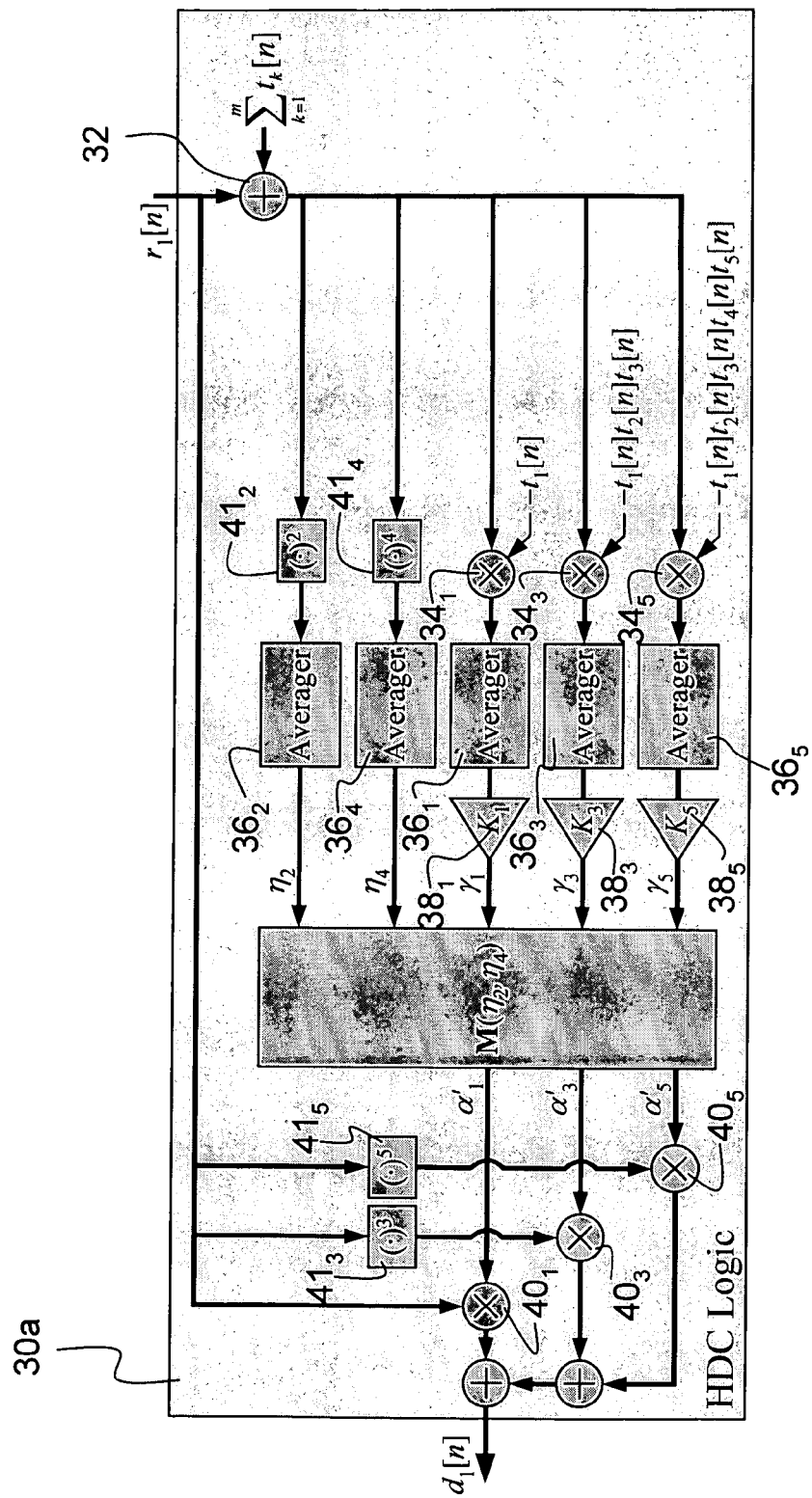
FIG. 4 illustrates preferred embodiment logic for a method and circuit of the invention that corrects first-order, third-order, and fifth-order residue amplifier distortion.

For example, suppose again that $f(v_1)=\alpha_1 v_1+\alpha_3 v_1^3+\alpha_5 v_1^5$. In this case, 5 calibration sequences are used, each of which takes on values of $\pm A$ where $A=\Delta/20$. FIG. 4 illustrates a correction circuit 30a, where $K_i=A^{-2i}/(i!)$. Reference numbers from FIG. 3 are used in FIG. 4 to illustrate similar elements of the correction circuit 30a. Subscripts on reference numbers indicate the order of harmonic distortion being addressed by handled by particular elements of the circuit 30a.

The circuit 30a calculates $\gamma_1, \gamma_3,$ and $\gamma_5$ in the same fashion as the circuit 30, and also calculates averages of $r_1^2[n]$ and $r_1^4[n]$ which are denoted as $\eta_2$ and $\eta_4$, respectively. By the analysis presented above, $\gamma_1$ converges to the quantity given by equation (14), $\gamma_3$ converges to the quantity given by equation (13), $\gamma_5$ converges to $\alpha_5$, and $\eta_2$ and $\eta_4$ converge to $\langle e_{ADC1}^2[n] \rangle$ and $\langle e_{ADC1}^4[n] \rangle$, respectively. Therefore, the vector $\alpha'=M(\eta_2, \eta_4)\gamma$ converges to $\alpha$ where $$\alpha = \begin{bmatrix} \alpha_1 \\ \alpha_2 \\ \alpha_3 \end{bmatrix},$$

$$\gamma = \begin{bmatrix} \gamma_1 \\ \gamma_2 \\ \gamma_3 \end{bmatrix},$$

and $M(\eta_2, \eta_4)$ is $$\begin{bmatrix} 1 & -13A^2 - 3\eta_2 & -241A^4 + 390A^6 + 90A^4\eta_2 + 30\eta_2^2 - 5\eta_4 \\ 0 & 1 & -30A^2 - 10\eta_2 \\ 0 & 0 & 1 \end{bmatrix}.$$

The correction circuit 30a uses the resulting estimated values of $\alpha_1, \alpha_3,$ and $\alpha_5$ to cancel the corresponding distortion terms in the pipelined ADCs output sequence.

The $\gamma_k$ values calculated by the logic of the corrections circuits 30 and 30a can be written as $$\gamma_k = \frac{1}{k!A^k P} \sum_{i=0}^{P-1} s_1[i]c[i] \tag{15}$$

where $$c[n] = \begin{cases} 1 & \text{if } t_1[n]t_2[n]\ldots t_k[n] > 0 \\ -1 & \text{otherwise} \end{cases}$$

and P is the number of samples averaged by the averager blocks $36_m$. The sign of the product of the calibration sequences, $c[n]$, is a random sequence, so for any finite value of P, $\gamma_k$ is a random variable.

If the averagers $36_m$ in the corrections circuits 30 and 30a were ideal, they would evaluate equation (15) in the limit as $P \to \infty$ in which case $\gamma_k$ would converge to its ideal value, $Y_{k|ideal}$. However, P is finite in any practical averager, so the convergence process is incomplete and this introduces a random estimation error component. The mean squared value of the estimation error, i.e., $E\{(\gamma_k-Y_{k|ideal})^2\}$, can be used to quantify the estimation error. By its definition, $c[n]$ is a white random sequence with zero mean and unity variance. It is independent of the pipelined ADCs input sequence, any term that does not contain one or more of the sequences $t_1[n], t_2[n], \ldots, t_k[n]$ as factors, and any term that contains a calibration sequence other than $t_1[n], t_2[n], \ldots, t_k[n]$ as a factor. With A set to $\Delta/(4m)$ (to provide a specific example), it follows from these properties and equation (15) that $$E\{(\gamma_k - \gamma_k \mid_{ideal})^2\} = \frac{1}{P}\left(\frac{4m}{\Delta}\right)^{2k}\left(\frac{1}{k!}\right)^2\left(\frac{1}{P}\sum_{i=0}^{P-1} u_i^2[i]\right), \tag{16}$$

where m is the number of calibration sequences, and $u_1[n]$ is equal to $s_1[n]$ minus the terms that are correlated with $c[n]$. Equation (16) specifies the relationship between the number of samples averaged and the convergence accuracy of the logic used in the correction circuits 30 and 30a. By the design of the pipelined ADC, $|u_1[n]|<\Delta$, so equation (16), viewed as a function of P, has the form of a bounded sequence divided by P. This implies that the estimation error goes to zero as $P \to \infty$.

The required convergence time is the minimum value of P for which the correction circuit is able to measure all the $\alpha_k$ values with sufficient accuracy that the error arising from residue amplifier distortion is canceled to the point that the target specifications of the pipelined ADC are met. Equation (16) gives insight into which terms affect the required convergence time.

A closed-form expression for the required convergence time is not presently known. However computer simulations can be used to determine the required convergence time on a case-by-case basis for a given pipelined ADC implementation.

One insight offered by equation (16) is that the mean squared estimation error for a given value of P gets worse as k is increased. The number of calibration sequences, m, must at least equal the order of the highest-order distortion term to be measured by the correction circuit, so m is at least as large as k in (16), and the mean squared estimation error is proportional to $m^{2k}$. Thus, the highest-order distortion term to be measured generally determines the required convergence time. As an example, if the third-order distortion term is the highest term measured by the logic of the correction circuit, this term causes the required convergence time (according to simulations discussed below) to be on the order of 4 billion samples (e.g., 40 seconds worth of samples at a sample-rate of 100 MHz).

To simplify the presentation the harmonic distortion correction (HDC) performed by the circuits, it was assumed that the only non-ideal analog component in the pipelined ADC is the residue amplifier $16_1$ in the first pipeline stage $10_1$. However, the harmonic distortion correction methods and logic of the correction circuits 30 and 30a also function effectively in the presence of realistic circuit non-idealities. The logic used in the circuits 30 and 30a and presented in the analysis above works in the presence of any signal that is statistically independent of the calibration sequences. Circuit noise does not bias the convergence process.

This leaves distortion (from components other than the residue amplifier) as the only potential non-ideal circuit behavior that can significantly affect the convergence. For example, if the DAC in a pipeline stage to which the invention is applied introduces non-negligible, non-linear distortion, an imperfect correction of residue amplifier distortion can result.

In practice, this situation is readily avoided in integrated circuit design with dynamic element matching (DEM) to scramble component mismatches, permitting the DACs in a pipelined ADC to be implemented with extremely high linearity. Segmentation techniques can be used to create DEM DACs that handle extra levels required to accommodate the calibration sequences with very little extra hardware complexity or latency. See, e.g., E. Siragusa & I. Galton, "A Digitally Enhanced 1.8V 15b 40 MS/s CMOS Pipelined ADC," IEEE Journal of Solid-State Circuits, vol. 39, no. 12, pp. 2126-2138, December 2004.

The largest benefit to the harmonic distortion correction of the invention is obtained in the initial stage(s) of a pipelined ADC. In the example pipelined ADCs of the invention presented in FIGS. 3 and 4, the correction methods and circuits of the invention have been applied to the first pipeline stage. However, it can be applied simultaneously to as many of the pipeline stages as necessary. As can be deduced from equation (3) and FIG. 1, for each k=1, . . . , 6, the combination of pipeline stages $10_k$, through $10_7$ and the associated digital logic is a pipelined ADC in its own right with a resolution of approximately 2(6−k)+3 bits. Correction of the invention can be applied simultaneously to any of the first 6 pipeline stages provided calibration sequences $t_1[n]t_2[n]–t_m[n]$ are used in each stage that are independent of those used in the other stages. Decreasing benefit is reached with each successive stage, though, so most cases will suggest using the method in one or a few of the initial stages to reduce circuit complexity. Any distortion introduced by the kth pipeline stage is attenuated by a factor $4^{k-1}$ referred to the output, so the distortion introduced by all but the first few stages tends to be negligible. Consequently, in practice, it is only typically necessary to apply the HDC correction of the invention to the first one, two or few stages.

Figure 5:
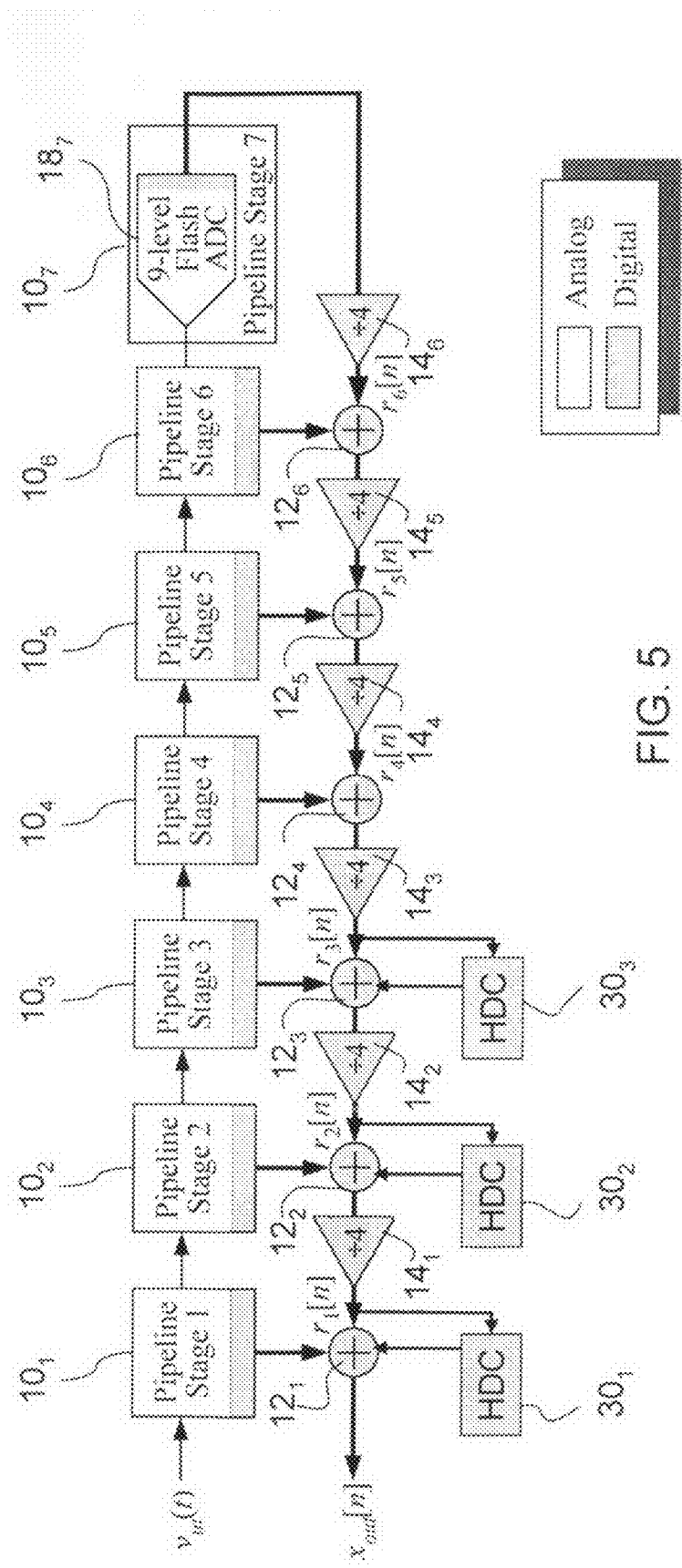
FIG. 5 is high-level view of a preferred embodiment pipelined ADC with nonlinear error correction of the invention applied to the initial first three stages of the pipelined ADC.
Figure 6:
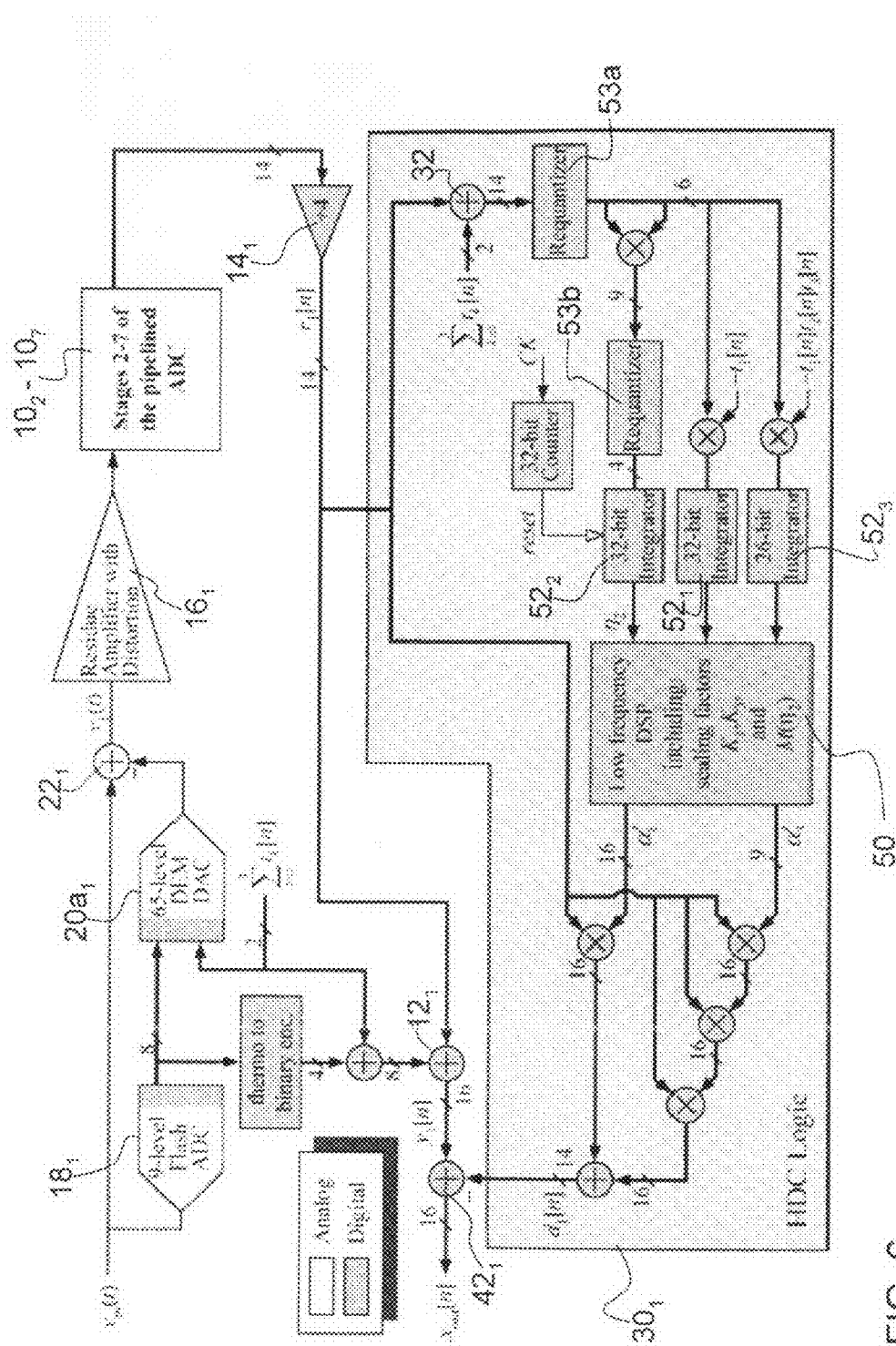
FIG. 6 illustrates logic used in a circuit of the first stage of the FIGS. 4-7 embodiment.

An example implementation will now be considered. FIG. 5 illustrates a pipelined ADC circuit of the invention with harmonic distortion correction circuits $30_1$, $30_2$, $30_3$ applied to the first three stages $10_1$, $10_2$, and $10_3$, of the pipelined ADC. FIG. 6 shows a high level hardware implementation for the first stage correction circuit $30_1$ that implements correction on the $1^{st}$ and $3^{rd}$ order harmonics. A low frequency digital signal processor 50 handles scaling, and integrators $52_2$, $52_1$, $52_3$ the averaging. Three pseudo-random ±Δ/16 calibration sequences are added prior to the DAC, so the sum of the calibration sequences is a four-level sequence that can range from −3Δ/16 to 3Δ/16 in steps of Δ/8. The use of three ±Δ/16 calibration sequences has two analog circuit implications. The first implication is that the DAC must have a minimum step-size of Δ/8 (instead of Δ as in the fourth through seventh pipeline stages) and enough levels to accommodate the calibration sequences. To avoid exceeding the input range of the DAC, the sum of the calibration sequences are forced to Δ/16 and the HDC estimators for the pipeline stage are disabled when the output of the flash ADC is either at its maximum or minimum value. Therefore, the sum of the calibration sequences and the flash ADC output can take on values of $$kΔ+iΔ/8+Δ/16, \quad (17)$$

where $$k = -4, -3, \ldots, 4$$

and $$i = \begin{cases} -2, -1, 0, 1 & \text{if } |k| \le 3 \\ 0 & \text{if } |k| = 4 \end{cases}$$

so the DAC must be able to generate these output levels. The second implication is that the calibration sequences occupy almost half of what would otherwise have been the over-range margin. Specifically, it follows from the above analysis that the over-range margin for each of the first three stages is ±1.75Δ. While this tightens the design constraints on the flash ADC, it is not difficult to handle in practice.

The practical version of the harmonic distortion correction logic shown in FIG. 6 is a direct implementation of ideal version shown in FIG. 4, except without fifth-order distortion correction. The primary differences between the practical and ideal versions are that requantization is used to reduce the bit widths of various data buses to reduce digital complexity, and the three averagers $52_1$,-$52_2$ are implemented with P=$2^{32}$ in the practical version and the last one $52_3$ is 26 bits. Dithered requatizers 53a and 53b are used to perform the requantization as described in E. J. Siragusa, I Galton, "Gain error correction technique for pipelined analogue-to-digital converters," IEEE Electronics Letters, vol. 36, no. 7, p. 617-618, Mar. 30, 2000 to avoid introducing harmonic distortion. Requantization is not necessary, but by reducing data bus widths it greatly reduces the area and power consumption of the harmonic distortion correction (HDC) correction circuit 30's logic, yet the quantization noise it introduces adds only slightly to the HDC convergence time. The random dither sequences and calibration sequences in this example were generated by a single linear feedback shift register of the form described in E. Fogleman, I. Galton, W. Huff, H. Jensen, "A 3.3-V Single-Poly CMOS Audio ADC Delta-Sigma Modulator with 98-dB Peak SINAD and 105-dB Peak SFDR," IEEE Journal of Solid-State Circuits, vol. 35, no. 3, pp. 297-307, March 2000.

Figure 7:
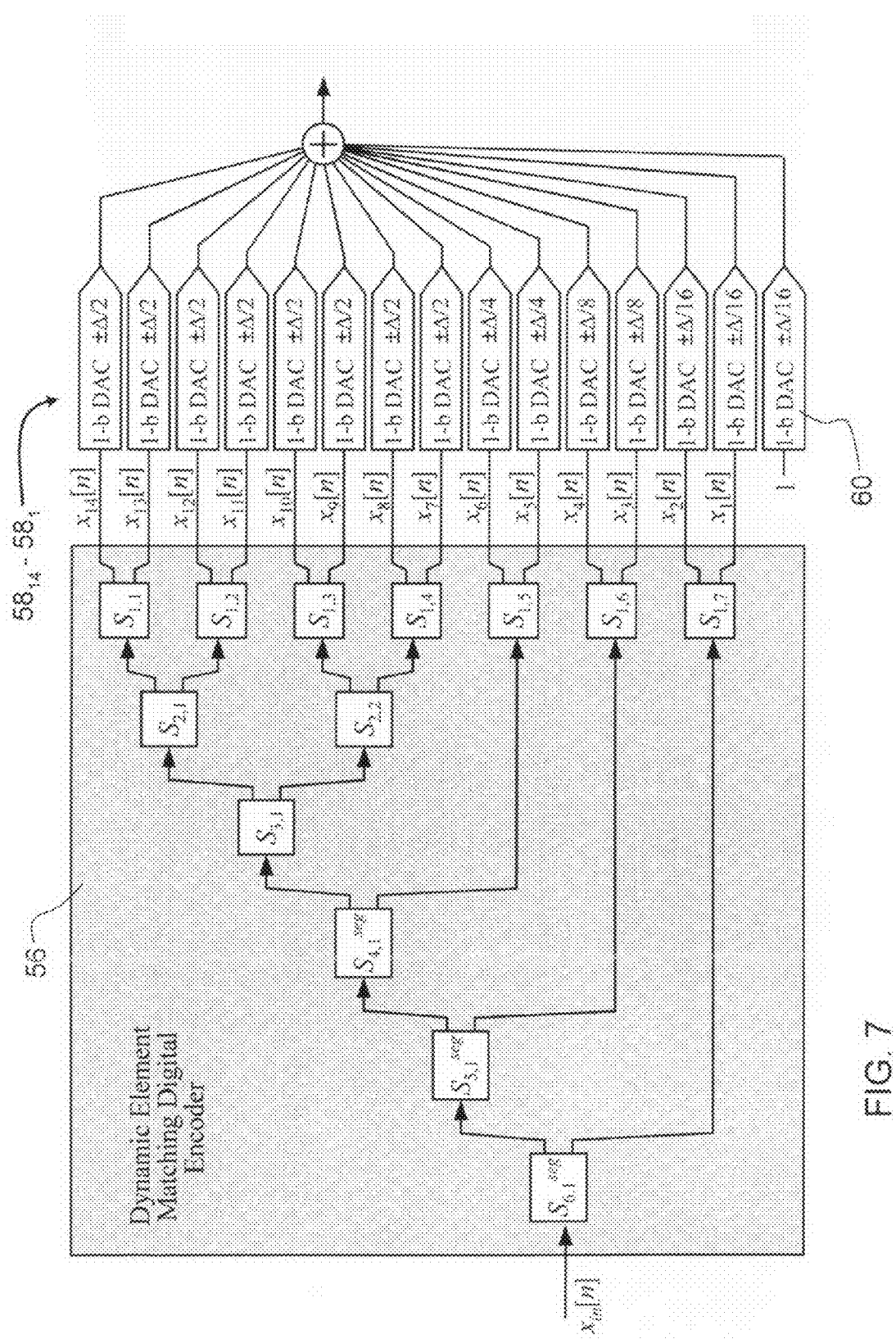
FIG. 7 illustrates a Dynamic Element Matching (DEC) DAC preferably used in the FIGS. 4-7 embodiment.

FIG. 7 shows the high-level structure of a DEM (dynamic element matching) DAC $16_k$, used in the first three pipeline stages. As described above, the DAC $16_k$ in each of the first three stages should be capable of generating the output levels specified by equation (17). This can be accomplished by the DAC architecture shown in FIG. 7. It consists of a digital DEM encoder block 56 and 15 1-bit DACs $58_1$,-$58_{14}$, 60 Each one-bit DAC $58_1$,-$58_{14}$ outputs a nominal value of −qΔ or qΔ depending upon whether its input bit is 0 or 1, respectively, where q is a weighting factor that is fixed for a given 1-bit DAC. There are three 1-bit DACs with q=1/16 (60, $58_1$, −$58_2$), two with q=1/8 ($58_3$, −$58_4$), two with q=1/4 ($58_5$, −$58_6$), and eight with q=1/2 ($58_7$, −$58_{14}$). The 1-bit DAC 60 provides a constant offset that centers dynamic range about zero, and matching is not critical. With this 1-bit DAC weighting arrangement, for most of the possible input values, $x_{in}[n]$, there are multiple distinct bit vectors, $x_1[n]$, $x_2[n]$, . . . , $x_{14}[n]$, that give rise to the desired nominal output value. At each sample clock, the DEM encoder pseudo-randomly selects one of these multiple, nominally equivalent vectors.

If all the 1-bit DAC step-sizes were ideal, the pseudo-random selection algorithm in the DEM encoder would have no effect. However, inadvertent component mismatches arise during circuit fabrication which causes the 1-bit step-sizes to deviate from their ideal values. If only one of the possible values of the 1-bit DAC input vector, $x_1[n]$, $x_2[n]$, . . . , $x_{14}[n]$, were used for each value of $x_{in}[n]$, the step-size errors would cause the overall DAC to introduce harmonic distortion. By pseudo-randomly choosing among the different possible 1-bit DAC input vectors for each input sample, the DEM encoder causes the overall DAC to introduce white noise that is uncorrelated with the other sequences in the pipelined ADC instead of harmonic distortion, and the white noise can be removed in the digital domain by a background calibration technique. See, e.g., E. Siragusa, I. Galton, "A Digitally Enhanced 1.8V 15b 40 MS/s CMOS Pipelined ADC," IEEE Journal of Solid-State Circuits, vol. 39, no. 12, pp. 2126-2138, December 2004; I. Galton, "Digital Cancellation of D/A Converter Noise in Pipelined A/D Converters," IEEE Transactions on Circuits and Systems II: Analog and Digital Signal Processing, vol. 47 no. 3, pp. 185-196, March 2000.

From a signal processing point of view the DEM encoder can be viewed as a tree of digital logic blocks called switching blocks, labeled $S_{k,r}$ or $S_{k,r}^{seg}$ in FIG. 7, where k and r denote the position of the switching block in the tree. The three switching blocks labeled $S_{k,r}^{seg}$ in FIG. 7 are referred to as segmented switching blocks because in each case their two outputs affect the input bits to 1-bit DACs with different weighting factors. The ten switching blocks labeled $S_{k,r}$ are referred to as non-segmented switching blocks because in each case their two outputs only affect the input bits to 1-bit DACs with equal weighting factors.

Each switching block operates on a digital input sequence and generates two digital output sequences. The output sequences generated by each segmented switching block, $S_{k,r}^{seg}$, are given by $$x_{k-1,1}[n] = \frac{x_{k,r}[n] + s_{k,r}[n]}{2}, \quad (18)$$

and $$x_{1,k+1}[n] = -s_{k,r}[n],$$

where $x_{k,r}[n]$ is the input to the switching block and $s_{k,r}[n]$ is a pseudo-random sequence, referred to as a switching sequence. The switching sequence is generated as part of the switching block logic as $$s_{k,r}[n] = \begin{cases} 0 & \text{if } x_{k,r}[n] \text{ is even} \\ \pm 1 & \text{otherwise (chosen pseudo-randomly)} \end{cases} \quad (19)$$

The output sequences generated by each non-segmented switching block, $S_{k,r}$, are given by $$x_{k-1,2r}[n] = \frac{x_{k,r}[n] + s_{k,r}[n]}{2}, \quad (20)$$

and $$x_{k-1,2r-1}[n] = \frac{x_{k,r}[n] - s_{k,r}[n]}{2},$$

where, as before, $X_{k,r}[n]$ is the input to the switching block and $S_{k,r}[n]$ is a switching sequence given by equation (19). The results presented in A. Fishov, E. Siragusa, J. Welz, E. Fogleman, I. Galton, "Segmented mismatch-shaping D/A conversion" in Proc. of the IEEE International Symposium on Circuits and Systems, May 2002 show that the DEM encoder ensures that output level errors in the 1-bit DACs from component mismatches do not cause the overall DAC to introduce harmonic distortion, which is important for implementation of methods of the invention to function well.

It follows from equations (18), (19), and (20) that the data paths through the switching blocks are not clocked, so the DEM encoder could be implemented directly as combinational logic. However, in high-speed pipelined ADCs, latency from the output of the flash ADC through the DAC in each pipeline stage must be minimized because the larger the latency the less time is available for the residue amplifier following the DAC to settle. In E. Siragusa, I. Galton, "A Digitally Enhanced 1.8V 15b 40 MS/s CMOS Pipelined ADC," IEEE Journal of Solid-State Circuits, vol. 39, no. 12, pp. 2126-2138, December 2004, this issue was addressed by implementing the functionality of both the calibration sequence adder and the DEM encoder in parallel as a single layer of digital transmission gates along with some digital logic gates through which latency is not critical. This reduced the latency from the output of the flash ADC through the DEM encoder to that of a single transmission gate. Although the DEM encoder shown in FIG. 7 is more complicated than that presented in E. Siragusa, I. Galton, "A Digitally Enhanced 1.8V 15b 40 MS/s CMOS Pipelined ADC," IEEE Journal of Solid-State Circuits, vol. 39, no. 12, pp. 2126-2138, December 2004, the same approach can be taken for implementation and has been adopted in the computer simulated implementation described below. Since the calibration sequences are known in advance of the flash ADC output data, only the combinational logic component through which latency is not critical is increased in this example relative to the DEM encoder presented in E. Siragusa, I. Galton, "A Digitally Enhanced 1.8V 15b 40 MS/s CMOS Pipelined ADC," IEEE Journal of Solid-State Circuits, vol. 39, no. 12, pp. 2126-2138, December 2004.

Simulation Results

The residue amplifier distortion for this simulation is modeled after the behavior observed via transistor-level circuit simulations in the pipelined ADC of E. Siragusa, I. Galton, "A Digitally Enhanced 1.8V 15b 40 MS/s CMOS Pipelined ADC," IEEE Journal of Solid-State Circuits, vol. 39, no. 12, pp. 2126-2138, December 2004. for a sample-rate of 100 MHz. Specifically, for each residue amplifier, the non-negligible distortion terms in (5) are $\alpha_1 = -0.0125$, $\alpha_3 = -2^{-6} \Delta^{-2}$, $\alpha_5 = -2^{-9} \Delta^{-4}$, and $\alpha_7 = -2^{-11} \Delta^{-6}$, where $\Delta = 250$ mV is the step-size of the flash ADC. It can be deduced for this case from the analysis above that only the first-order and third-order residue amplifier distortion terms in the first three pipeline stages need be cancelled to achieve 15-bit pipelined ADC accuracy. Therefore, the HDC method of the invention is applied in this example to measure and cancel just these distortion terms. At a sample-rate of 100 MHz with P=232, each HDC block requires approximately 43 seconds to converge. However, the accuracy of each HDC block depends on the accuracies of the HDC blocks in the subsequent stages. Thus, the total convergence time for this example implementation is approximately 2 minutes.

The example pipelined ADC with HDC as illustrated in FIGS. 5-7 was simulated with various non-ideal circuit effects. The simulated residue amplifier distortion in each stage includes the first through seventh-order distortion terms described above. The 1-bit DAC mismatches were chosen as independent Gaussian random variables; the standard deviations of the 1-bit DACs with step-sizes of $\Delta$, $\Delta/2$, $\Delta/4$ and $\Delta/8$ are 0.30%, 0.42%, 0.60%, 0.85%, of $\Delta$=250 mV, respectively. The flash ADC threshold errors and residue amplifier offset voltages were chosen as independent Gaussian random variables with standard deviations of 25 mV and 5 mV, respectively. A 10 nV$_{rms}^2$ white noise signal was added at the input of each residue amplifier to model thermal noise.

Figures 8A, 8B, 8C:
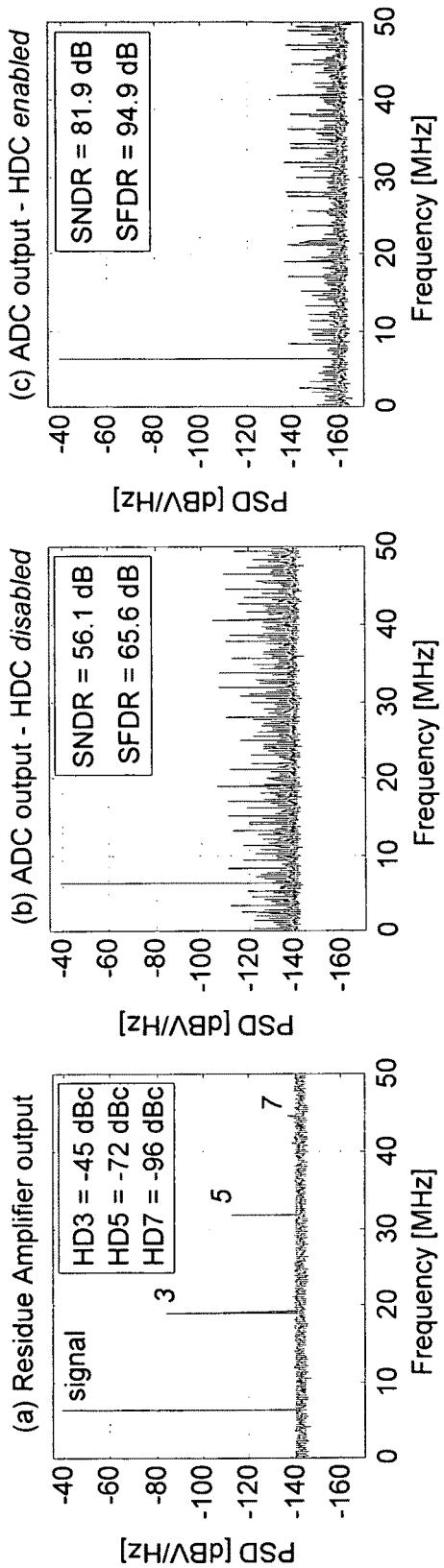
FIGS. 8A-8C provide simulation results for the FIGS. 4-7 embodiment.

FIG. 8A shows the power spectral density (PSD) plot (estimated using 16 Hanning windowed periodograms of length 16384) of the output of the residue amplifier simulated alone with a 275 mV, 6.4 MHz sinusoidal input signal. The amplitude of the input signal is nearly the maximum input that does not overload the next stage of the pipeline. Hence, the output of the residue amplifier consists of the 6.4 MHz fundamental tone plus the residue amplifier distortion terms and thermal noise. The plot demonstrates the non-linear behavior of the residue amplifier.

FIGS. 8B and 8C show PSD plots of the pipelined ADC with a −1 dB relative to full scale 6.4 MHz sinusoidal input signal. FIG. 8B shows the case with the HDC method of the invention disabled, and FIG. 8C shows the case with the HDC method of the invention enabled. Comparison of FIGS. 8A and 8B indicate that method of the invention improved simulated SNDR and SFDR by 26 dB and 30 dB, respectively. Numerous other simulations with different input signals, and different random mismatches, ADC thresholds, and DAC mismatches, exhibit similar results.

Before computing the PSD estimates for the simulation results shown in FIGS. 8B and 8C, the components of the final output signal corresponding to DAC mismatches and thermal noise were removed so as not to obscure the effect of the HDC method. Removal of the components corresponding to DAC mismatches can be achieved in a practical implementation via the DNC technique presented in E. Siragusa, I. Galton, "A Digitally Enhanced 1.8V 15b 40 MS/s CMOS Pipelined ADC," IEEE Journal of Solid-State Circuits, vol. 39, no. 12, pp. 2126-2138, December 2004; I. Galton, "Digital Cancellation of D/A Converter Noise in Pipelined A/D Converters," IEEE Transactions on Circuits and Systems II: Analog and Digital Signal Processing, vol. 47 no. 3, pp. 185-196, March 2000. However, the DNC technique is not necessary for the HDC method of the invention to function well, provided that dynamic element matching DACs are used to ensure that error introduced by DAC mismatches does not contain significant harmonic distortion.

The embodiments of the invention discussed above with respect to FIGS. 4 and 6 can fail to produce accurate correction if the error is too big, i.e. if the $\alpha_n$ coefficients in (5) are too large. An open loop residue amplifier configuration can produce such large errors if used instead of a classical closed loop configuration. For example, if the distortion function given by (5) can be written as $$f(v_1(nT_s)) = \alpha_1 v_1(nT_s) + \alpha_3 v_1^3(nT_s) \quad (21)$$

and the digitized residue, $r_1[n]$, in FIG. 6 is given by $$r_1[n] \cong (1+\alpha_1)v_1(nT_s) + \alpha_3 v_1^3(nT_s), \quad (22)$$

the correction signal $d_1[n]$ is $$d_1[n] \cong (\alpha'_1 + \alpha'^2_1)v_1(T_s) + (\alpha'_3 + 4\alpha'_1\alpha'_3 + 3\alpha'^2_1\alpha'_3 + \alpha'^3_1\alpha'_3)v_1^3(nT_s) + \quad (23)$$
$$(3\alpha'^2_3 + 6\alpha'_1\alpha'^2_3 + 3\alpha'^2_1\alpha'^2_3)v_1^5(nT_s) + \ldots$$

Subtracting equation (23) from the uncorrected output given by equation (6), using equation (21), and assuming that $\alpha_n \approx d_n$, the pipeline output is $$x_{out}[n] \cong x_{out}[n]|_{ideal} - \alpha_1^2 v_1(nT_s) - (4\alpha_1\alpha_3 + 3\alpha_1^2\alpha_3 + \alpha_1^3\alpha_3)v_1^3(nT_s) - \quad (24)$$
$$(3\alpha_3^2 + 6\alpha_1\alpha_3^2 + 3\alpha_1^2\alpha_3^2)v_1^5(nT_s) -$$
$$(3\alpha_3^3 + 3\alpha_1\alpha_3^3)v_1^7(nT_s) - \alpha_3^4 v_1^9(nT_s).$$

comparing equation (24) to equation (6), it is clear that harmonic distortion correction of the invention removes most of the distortion provided the $\alpha_n$ coefficients are sufficiently small. However, in some applications this may not be the case, in which case the remaining unwanted terms in equation (24) may not be negligible for the given application.

Figure 9:
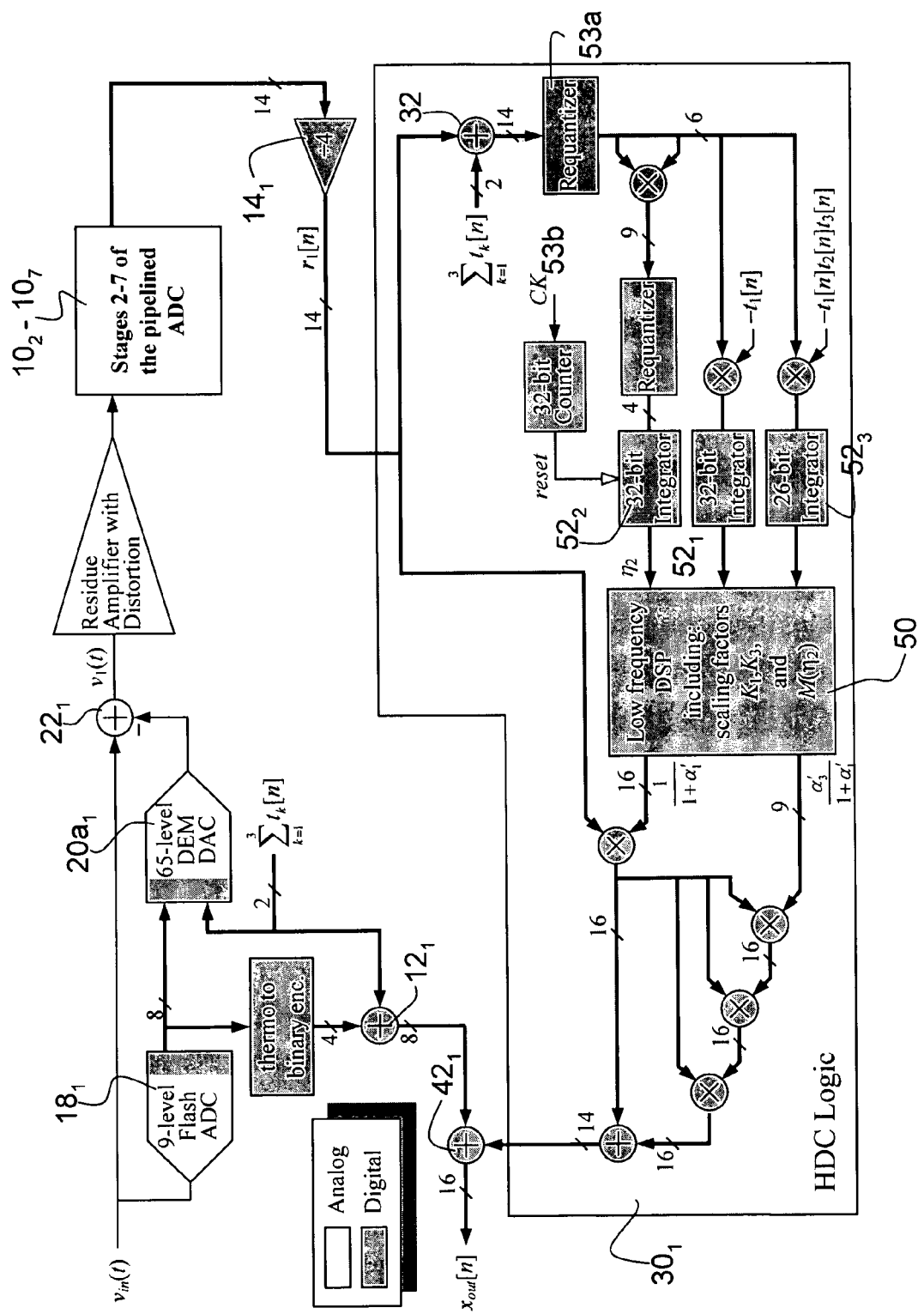
FIG. 9 illustrates a modification of the FIG. 6 logic for improving correction in cases having large distortion coefficients.

FIG. 9 illustrates a modified correction circuit that can be used in such cases. The difference in operation compared to FIG. 6 can be understood through a similar analysis to that which was discussed above. The pipelined ADC output is now:

$$x_{out}[n] \cong x_{out}[n]|_{ideal} - \frac{3\alpha_3^2}{(1+\alpha_1)^2} v_1^5(nT_s) - \quad (25)$$
$$\frac{3\alpha_3^3}{(1+\alpha_1)^3} v_1^7(nT_s) - \frac{\alpha_3^4}{(1+\alpha_1)^4} v_1^9(nT_s).$$

Equation (25) shows that linear and third-order distortion has been removed, while the remaining unwanted terms are smaller than or comparable to the respective terms in equation (24). The price paid for the accuracy improvement is increased complexity. Although the FIG. 6 and FIG. 9 arrangements require the same number of multipliers, the extension of the FIG. 9 logic to correct for higher-order harmonics would result in a more complex hardware.

Another can arise if the harmonic distortion correction of FIG. 6 is expanded to correct fifth order residue amplifier distortion. The fifth-order distortion term for this case is so small that high-order distortion from the coarse quantization performed by the flash ADCs in each stage becomes significant and distorts the estimate of the harmonic distortion. Equation (12) represents the signal used to estimate the first stage's residue amplifier distortion terms under the assumption that the following stages are either ideal or perfectly corrected. A more accurate expression for $s_1[n]$ is $$s_1[n] \cong -e_{ADC1}[n] + \alpha_1 v_1(nT_s) + \quad (26)$$
$$\alpha_3 v_1^3(nT_s) + \alpha_5 v_1^5(nT_s) + \sum_{k=2}^{7} \lambda_k e_{ADCk}[n] + \ldots,$$

where the $\lambda_k$ is the amplitude of uncanceled flash ADC error from the kth stage. Therefore in the absence of perfect cancellation, every flash ADC contributes error in (26). The error is largely quantization noise which tends to be highly correlated with $v_1[n]$ and therefore with the pseudorandom sequences. The smaller the $\alpha_n$ coefficients to be estimated by methods and circuits of the invention, the more significantly the imperfectly cancelled flash ADC errors distort the estimated coefficient values. The coarse quantization performed by the flash ADCs is a hard non-linearity, so it can not be represented by a small number of Taylor series terms. The methods and circuits assume the non-linearity to be estimated is well-modeled by a small number of Taylor series terms, which is frequently the case and provides a powerful technique for harmonic distortion correction. In the case where the non-linearity to be estimated is very small, an analog dither signal can be added prior to the flash ADCs to eliminate a problem of potentially inaccurate estimations in cases where very small distortions are to be estimated and corrected.

Artisans will recognize many applications of the invention. An ADC of the invention can be used in any mixed signal integrated circuit application. ADCs of the invention will be particularly advantageous, for example, in wide-bandwidth wireless communications.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method for estimating and correcting nonlinear error introduced by one or more residue amplifiers in a pipelined analog to digital converter integrated circuit, the method comprising steps of:
   in one or more stages of the amplifier, introducing pseudo random calibration sequences into the digital signal to be converted by a flash digital to analog converter in the one or more stages;
   sampling a digital residue signal of the output of the pipelined analog to digital converter prior to the one or more stages;
   from a sample of the digital residue signal, determining intermodulation products of the pseudo random calibration sequences that are present in the digital residue signal to estimate nonlinear error introduced by the residue amplifier in the one or more stages; and
   providing a digital correction signal to the output of the one or more stages to cancel estimated nonlinear error determined in said step of determining.

2. The method of claim 1, wherein the pseudo random calibration sequences are zero-mean and independent of the pipelined analog to digital converters input signal.

3. The method of claim 2, wherein an amplitude, A of the pseudo random calibration sequences is selected such that the sum of the calibration sequences has a maximum amplitude of approximately $\Delta/4$, wherein where $\Delta$ is the quantization step-size of a flash analog to digital converter of the one or more stages.

4. The method of claim 2, wherein an amplitude, A of the pseudo random calibration sequences is selected such that the sum of the calibration sequences takes up approximately half of the over-range margin a flash analog to digital converter of the one or more stages.

5. The method of claim 1, wherein a flash analog digital converter in the one or more stages has an extra number of levels to accommodate the pseudo random calibration sequences.

6. The method of claim 1, wherein said step of determining comprises multiplying the residue amplifiers output $r_k[n]$ of the one or more stages against the product of the pseudo random calibration sequences, $t_1[n]t_2[n]\cdot t_m[n]$.

7. The method of claim 6, wherein said step of determining comprises multiplying the digital sequence $$s_1[n] = r_1[n] + \sum_{k=1}^{m} t_k[n] \qquad (27)$$
$$= -e_{ADC1}[n] + \alpha_m v_1^m(nT_s) + \frac{1}{4096} e_{ADC7}[n]$$

by $$t_1[n]t_2[n] \cdot t_m[n];$$

and averaging the result.

8. The method of claim 1, wherein said pseudo random calibration sequences include at least a third order sequence.

9. A pipelined analog to digital converter integrated circuit, comprising:
   a plurality of pipeline stages;
   one or more residue amplifiers forming an initial part of the plurality of pipeline stages; and
   correction circuitry that digitally measures and cancels error arising from nonlinear error introduced by said one or more residue amplifiers by introducing pseudo random calibration sequences into the digital signal to be converted by a flash digital to analog converter in the one or more stages, determining intermodulation products of the pseudo random calibration sequences that are present in the digital residue signal to estimate nonlinear error introduced by the residue amplifier in the one or more stages, and providing a digital correction signal to the output of the one or more stages to cancel estimated nonlinear error.

10. The integrated circuit of claim 9, wherein the correction circuitry is applied to at least a first stage of the pipelined analog to converter and the correction circuitry comprises:
   a summer that obtains $s_1[n]$ by adding the residue signal of the first stage $r_1[n]$ with the calibration sequences $t_1[n], t_2[n], \ldots, t_m[n]$;
   a multiplier that then multiplies $s_1[n]$ with the calibration sequences $t_1[n], t_2[n], \ldots, t_m[n]$;
   an averager that provides the average of $s_1[n]$ times $t_1[n]t_2[n]\cdot t_m[n]$ over n, which is $(m!)A^{2m}\alpha_m$.
   an amplifier that multiplies the output of the averager by $K_m = A^{-2m}/(m!)$ to obtain $\gamma_m$;
   a multiplier that then multiplies $\gamma_m$ by $r_1^m[n]$, which is obtained by a exponential multiplier, to obtain an estimate of $\alpha_m v_1^m(nT_s) = d_1[n]$.

11. The integrated circuit of claim 10, wherein the negative of the estimate of $d_1[n]$ is then added to an output signal $y_1[n]$ of the first stage to cancel $\alpha_m v_1^m(nT_s)$.

12. The integrated circuit of claim 9, wherein a flash digital to analog converter in the one or more stages comprises a dynamic matching element (DEM) converter.

13. The integrated circuit of claim 12, wherein the DEM converter comprises:
   a digital DEM encoder block and plurality of 1-bit digital to analog converters, wherein
      each 1-bit digital to analog converters outputs a nominal value of $-q\Delta$ or $q\Delta$ depending upon whether its input bit is 0 or 1, respectively, where q is a weighting factor that is fixed for a given 1-bit DAC and $\Delta$ is the quantization step size; and
      at each sample clock, the DEM encoder pseudo-randomly selects the output of one of the 1-bit digital to analog converters.

14. A pipelined analog to digital converter, comprising:
a plurality of pipeline stages;
one or more residue amplifiers forming an initial part of the plurality of pipeline stages; and
correction circuitry means for introducing digital pseudo random sequences to the output of a flash analog to digital converter in one of more of the pipeline stages, for estimating residue amplifier distortion in the one or more stages from intermodulation products of the pseudo random sequences, and for correcting the output of the pipelined analog to digital converter with a correction value determined from the intermodulation products.

15. The integrated circuit of claim 14, wherein said correction circuitry means is applied to an initial stage of the plurality of pipeline stages.

16. The integrated circuit of claim 15, wherein said correction circuitry means is applied to a first three stages of the plurality of pipeline stages.

17. The integrated circuit of claim 1, wherein said correction circuitry estimates at least $1^{st}$ and $3^{rd}$ order residue amplifier distortion.

18. A method for estimating and correcting nonlinear error in an analog to digital converter the method comprising steps of:
introducing uncorrelated pseudo random sequences prior to a source of distortion;
after digital conversion, determining intermodulation products of the pseudo random sequences;
estimating nonlinear error from the intermodulation products and corrected for the nonlinear error.

* * * * *

UNITED STATES PATENT AND TRADEMARK OFFICE
CERTIFICATE OF CORRECTION

PATENT NO. : 7,602,323 B2
APPLICATION NO. : 12/080820
DATED : October 13, 2009
INVENTOR(S) : Galton et al.

It is certified that error appears in the above-identified patent and that said Letters Patent is hereby corrected as shown below:

Col. 5, line 21, please delete "kth" and insert -- $k$th -- in its place.

Col. 5, line 39, please delete "$e_{ADC\ 7}[n]$" and insert -- $e_{ADC\ 7}[n]$ -- in its place.

Col. 5, line 65, please delete "N Taylor" and insert -- $N$ Taylor -- in its place.

Col. 5, line 66, please delete "N typically" and insert -- $N$ typically -- in its place.

Col. 6, line 10, please delete the formula "$x_{out}[n]=x_{out[n]|ideal} + f(v_1(nT_s))$" and insert -- $x_{out}[n]=x_{out}[n]|_{ideal} + f(v_1(nT_s))$ -- in its place.

Col. 6, line 40, please delete "of m" and insert -- of $m$ -- in its place.

Col. 6, line 47, please delete "nth" and insert -- $n$th -- in its place.

Col. 6, line 63, please delete "M levels" and insert -- $M$ levels -- in its place.

Col. 7, line 37, please delete " $t_n[n]$" and insert -- $t_m[n]$ -- in its place.

Col. 8, line 8, please delete "small to last term" and insert -- small last term -- in its place.

Col. 9, line 10, please delete "$K_i = A^{-2}i/(i!)$" and insert -- $K_i = A^{-2i}/(i!)$ -- in its place.

Col. 9, line 66, please delete " P→∞)" and insert -- P→∞ -- in its place.

Col. 10, line 39, please delete "of P" and insert -- of $P$ -- in its place.

Col. 10, line 40, please delete "k is" and insert -- $k$ is -- in its place.

Col. 10, line 40, please delete ", m," and insert -- , $m$, -- in its place.

Col. 10, line 42, please delete "m is" and insert -- $m$ is -- in its place.

Col. 10, line 43, please delete "k in" and insert -- $k$ in -- in its place.

Col. 10, line 44, please delete "$m^{2k}$" and insert -- $m^{2k}$ -- in its place.

Col. 13, line 16, please delete "k and r" and insert -- $k$ and $r$ -- in its place.

Col. 14, line 51, please delete "P=232" and insert -- $P=2^{32}$ -- in its place.

CERTIFICATE OF CORRECTION (continued)
U.S. Pat. No. 7,602,323 B2

Col. 15, line 51, at the end of the formula, please delete "$v_1{}^3(nT_s)$" and insert -- $v_1^3(nT_s)$ -- in its place.

Col. 15, line 55, at the end of the formula, please delete "$v_1{}^3(nT_s)$" and insert -- $v_1^3(nT_s)$ -- in its place.

Col. 16, line 56, please delete "kth" and insert -- $k$th -- in its place.

Claim 3, Col. 17, line 49, please delete "amplitude, A" and insert -- amplitude, $A$ -- in its place.

Claim 4, Col. 17, line 55, please delete "amplitude, A" and insert -- amplitude, $A$ -- in its place.

Claim 6, Col. 17, line 67, please delete "$t_1[n]t_2[n]\text{-}t_m[n]$" and insert -- $t_1[n]t_2[n]\cdots t_m[n]$ -- in its place.

Claim 7, Col. 18, at the end of line 5, please delete "(27)" and insert -- (1) -- in its place.

Claim 7, Col. 18, line 11, please delete "$t_1[n]t_2[n] - t_m[n]$" and insert -- $t_1[n]t_2[n]\cdots t_m[n]$ -- in its place.

Claim 10, Col. 18, lines 42 and 43, please delete "$t_1[n]t_2[n]\text{-}t_m[n]$" and insert -- $t_1[n]t_2[n]\cdots t_m[n]$ -- in its place.

Claim 10, Col. 18, line 44, please delete "(m!)" and insert -- ($m!$) -- in its place.

Claim 10, Col. 18, line 46, please delete "(m!)" and insert -- ($m!$) -- in its place.

Signed and Sealed this

Sixteenth Day of February, 2010

David J. Kappos
*Director of the United States Patent and Trademark Office*